United States Patent
Matsukura

(10) Patent No.: US 8,368,045 B2
(45) Date of Patent: Feb. 5, 2013

(54) INFRARED PHOTODETECTOR

(75) Inventor: Yusuke Matsukura, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 1203 days.

(21) Appl. No.: 12/010,584

(22) Filed: Jan. 28, 2008

(65) Prior Publication Data

US 2010/0289061 A1 Nov. 18, 2010

(30) Foreign Application Priority Data

Jan. 30, 2007 (JP) ................... 2007-019117

(51) Int. Cl.
H01L 29/72 (2006.01)
(52) U.S. Cl. ............... 257/9; 257/14; 257/21; 977/774; 977/932; 250/338.4
(58) Field of Classification Search ............... 257/9, 14, 257/21; 977/774, 932; 250/338.4
See application file for complete search history.

(56) References Cited

U.S. PATENT DOCUMENTS

2005/0017176 A1* 1/2005 Koch et al. ............... 250/338.4

FOREIGN PATENT DOCUMENTS

JP 10-256588 9/1998

OTHER PUBLICATIONS

V. Ryzhii; "The theory of quantum-dot infrared phototransistors;" Semicond. Sci. Technol.; vol. 11; 1996; pp. 759-765 (7 Sheets.).
I. Vurgaftman, et al.; "Band parameters for III-V compound semiconductors and their alloys;" Journal of Applied Physics; vol. 89; No. 11; Jun. 1, 2001; pp. 5815-5875 (61 Sheets.).

* cited by examiner

Primary Examiner — Edward Wojciechowicz
(74) Attorney, Agent, or Firm — Kratz, Quintos & Hanson, LLP

(57) ABSTRACT

The infrared photodetector includes a contact layer formed over a semiconductor substrate 10, a quantum dot stack 24 formed on the contact layer 12 and including intermediate layers 22 and quantum dots 20 which are alternately stacked, and a contact layer 26 formed on the quantum dot stack 24. One of the plurality of intermediate layers, which is in contact with the contact layer, has an n-type impurity doped region 16 formed on a side nearer the interface with the contact layer 12.

18 Claims, 10 Drawing Sheets

INFRARED PHOTODETECTOR

CROSS-REFERENCE TO RELATED APPLICATIONS

This application is based upon and claims the benefit of priority from the prior Japanese Patent Application No. 2007-019117, filed on Jan. 30, 2007, the entire contents of which are incorporated herein by reference.

BACKGROUND OF THE INVENTION

The present invention relates to an infrared photodetector, more specifically, a quantum dot infrared photodetector using quantum dots in the infrared sensor.

As one of the infrared photodetectors, the quantum dot infrared photodetector using quantum dots in the infrared sensor is proposed. In comparison with the quantum well infrared photodetector using quantum wells in the infrared sensor, the quantum dot infrared photodetector has the merits of high detection sensitivity to the infrared radiation incident perpendicularly to the device surface, low probability of photo-excited carriers being recaptured and accordingly high photocurrent gain, and other merits. Thus, the quantum dot infrared photodetector is expected as an infrared photodetector providing large photocurrent, i.e., high sensitivity.

In the photodetector of large photocurrent, signal current can be detected even at relatively high operation temperatures without being buried in dark current (which increases exponentially with respect to the operation temperature) which is a noise source, and it is less necessary to cool the photodetector so as to suppress the dark current. Accordingly, the cooler can be simplified, and the infrared photodetector can be accordingly smaller-sized and can have lower costs.

The quantum dot infrared photodetector is disclosed in, e.g., Japanese published unexamined patent, application No. 10-256588 (hereinafter called Reference 1), and V. Ryzhii, "The theory of quantum dot infrared photodiodes", Semicond. Sci. Technol., Vol. 11, 1996, p. 759 (hereinafter called Reference 2).

As the proposed quantum dot infrared photodetector is known a quantum dot infrared photodetector using InAs or InGaAs, etc. as the quantum dots, and GaAs as the intermediate layer burying the quantum dots and the electrode layers. However, when such quantum dot infrared photodetector is actually manufactured, the quantum dot infrared photodetector does not provide the sensitivity as expected.

The quantum confinement in the quantum dots, which determines the operation of the infrared photodetector is determined by the potential barrier height between the InAs or InGaAs, etc., which is the material of the quantum dots, and the GaAs intermediate layer surrounding the quantum dots. The sensitivity which is lower than expected will be due to one cause that the potential barrier height for the quantum confinement is insufficient. To improve the sensitivity of the quantum dot infrared photodetector, it will be effective to use a material whose band width is larger than the GaAs intermediate layer, e.g., an AlGaAs intermediate layer.

However, it has been found that although such structure surely generally improves the sensitivity, the sensitivity improvement in the low current region, where the signal noise characteristics are good, is relatively lowered.

FIG. 10 is a graph schematically showing the relationships between the sensitivity and the dark current with the operation voltage of the quantum dot infrared photodetector varied. In the graph, the dotted line indicates the case that the intermediate layer is formed of GaAs, and the solid line indicates the case that the intermediate layer is formed of AlGaAs.

In the case that the intermediate layer is formed of AlGaAs, whose band width is larger than that of GaAs, the characteristics having the same inclination as the case that the GaAs intermediate layer (indicated by the broken line in the graph) is estimated. In the actually manufactured devices, however, as indicated by the solid line, the sensitivity relatively lowers in the low current region. The infrared photodetector uses, in many cases, such low current region so as to obtain good signal noise characteristics, and the relative reduction of the sensitivity in this region is a serious problem.

SUMMARY OF THE INVENTION

According to one aspect of an embodiment, there is provided an infrared photodetector comprising: a first contact layer formed over a semiconductor substrate; a quantum dot stack formed on the first contact layer and including a plurality of intermediate layers of a first semiconductor material and a plurality of quantum dots of a second semiconductor material whose band width is narrower than the first semiconductor material which are stacked alternately; and a second contact layer formed on the quantum dot stack, one of said plurality of intermediate layers, which is in contact with the first contact layer, containing an n-type impurity doped region formed on a side nearer the interface with the first contact layer.

DETAILED DESCRIPTION OF THE PREFERRED EMBODIMENTS

The infrared photodetector and the method of manufacturing the same according to an embodiment of the present invention will be explained with reference to FIGS. 1 to 9B.

Figure 1:
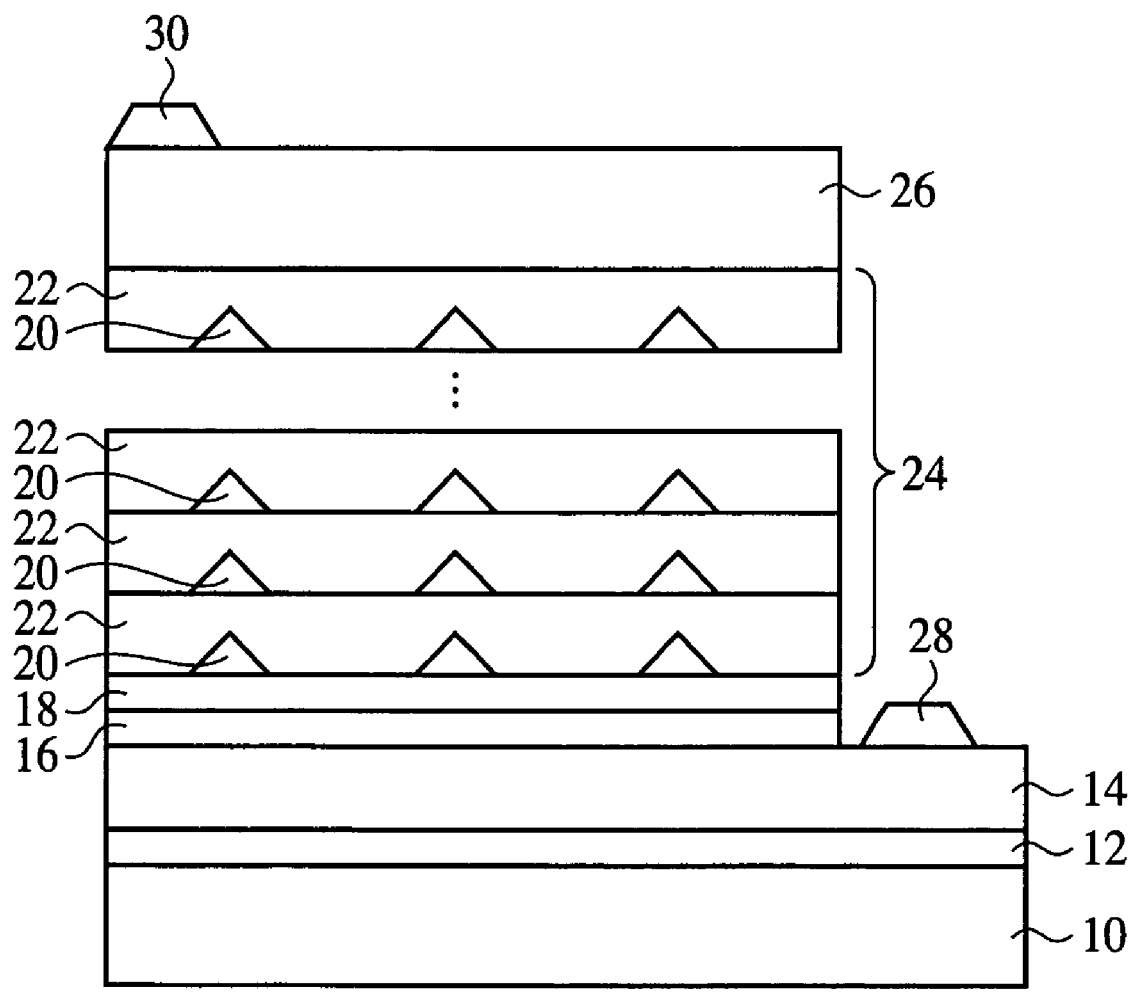
FIG. 1 is a diagrammatic sectional view showing the structure of the infrared photodetector according to an embodiment of the present invention.
Figure 2:
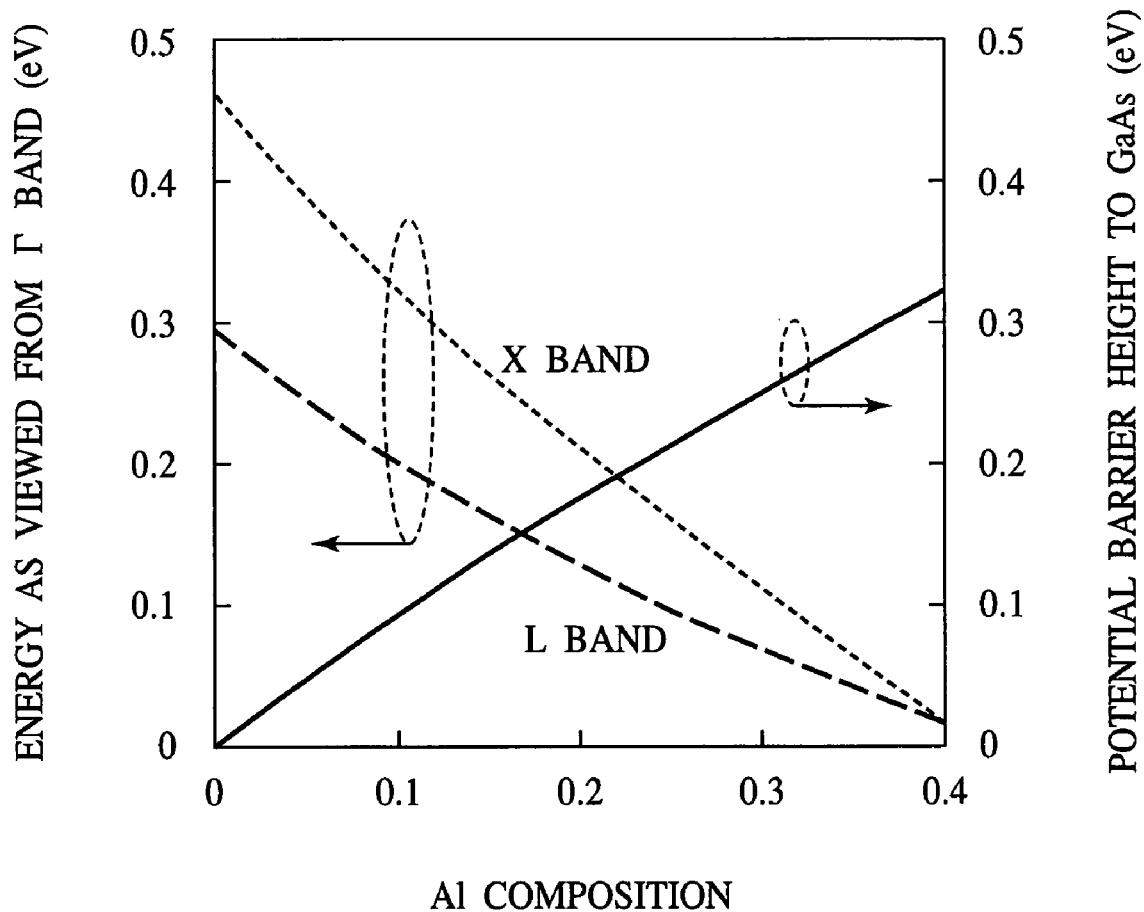
FIG. 2 is a graph showing the dependency of the energy heights of L band and X band from the Γ band of AlGaAs and the potential barrier height for GaAs on the Al composition of AlGaAs.
Figure 3:
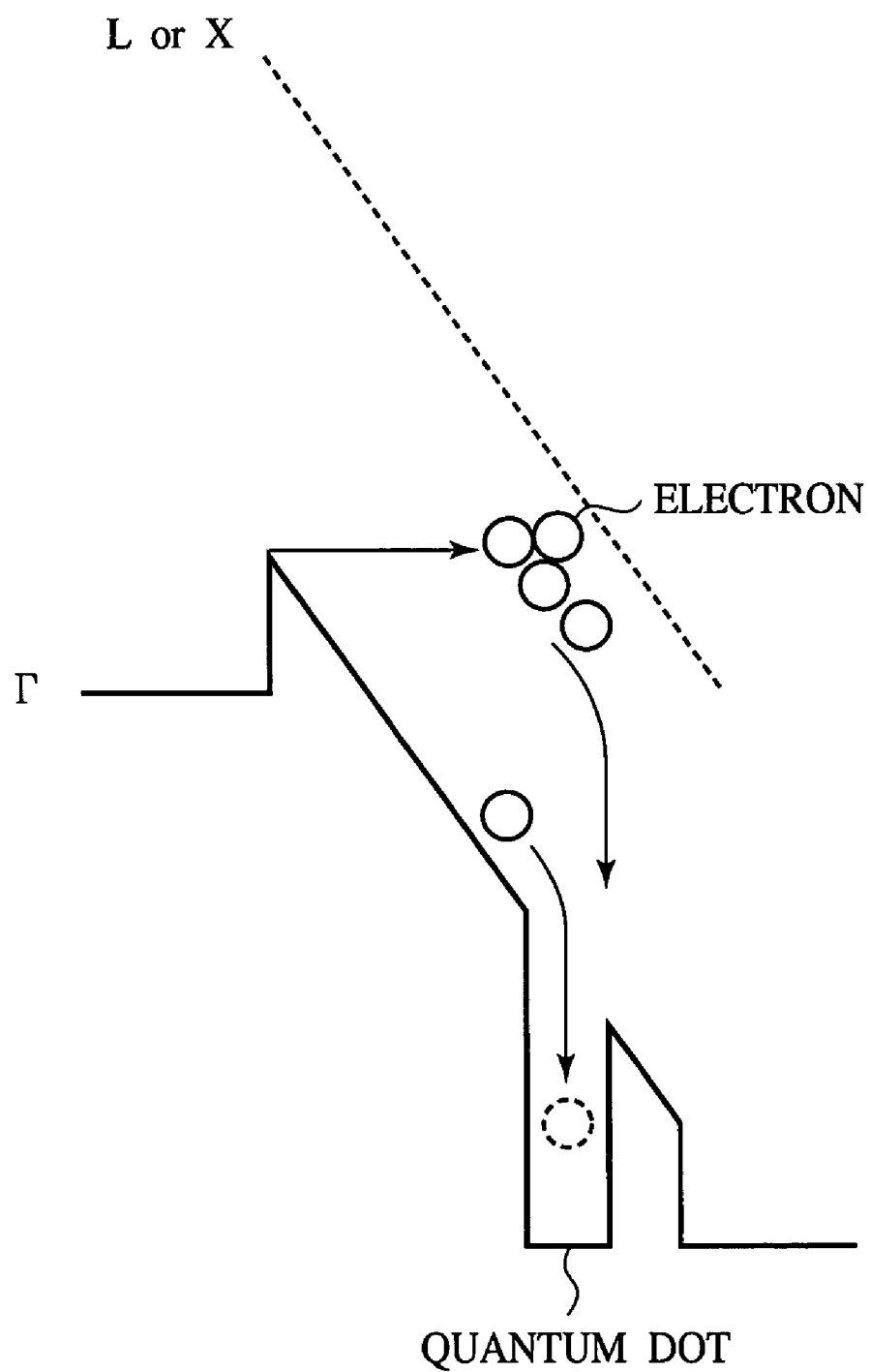
FIG. 3 is an energy band diagram schematically showing the operational state of the infrared photodetector using as the intermediate layer GaAs or AlGaAs of low Al composition.
Figure 4:
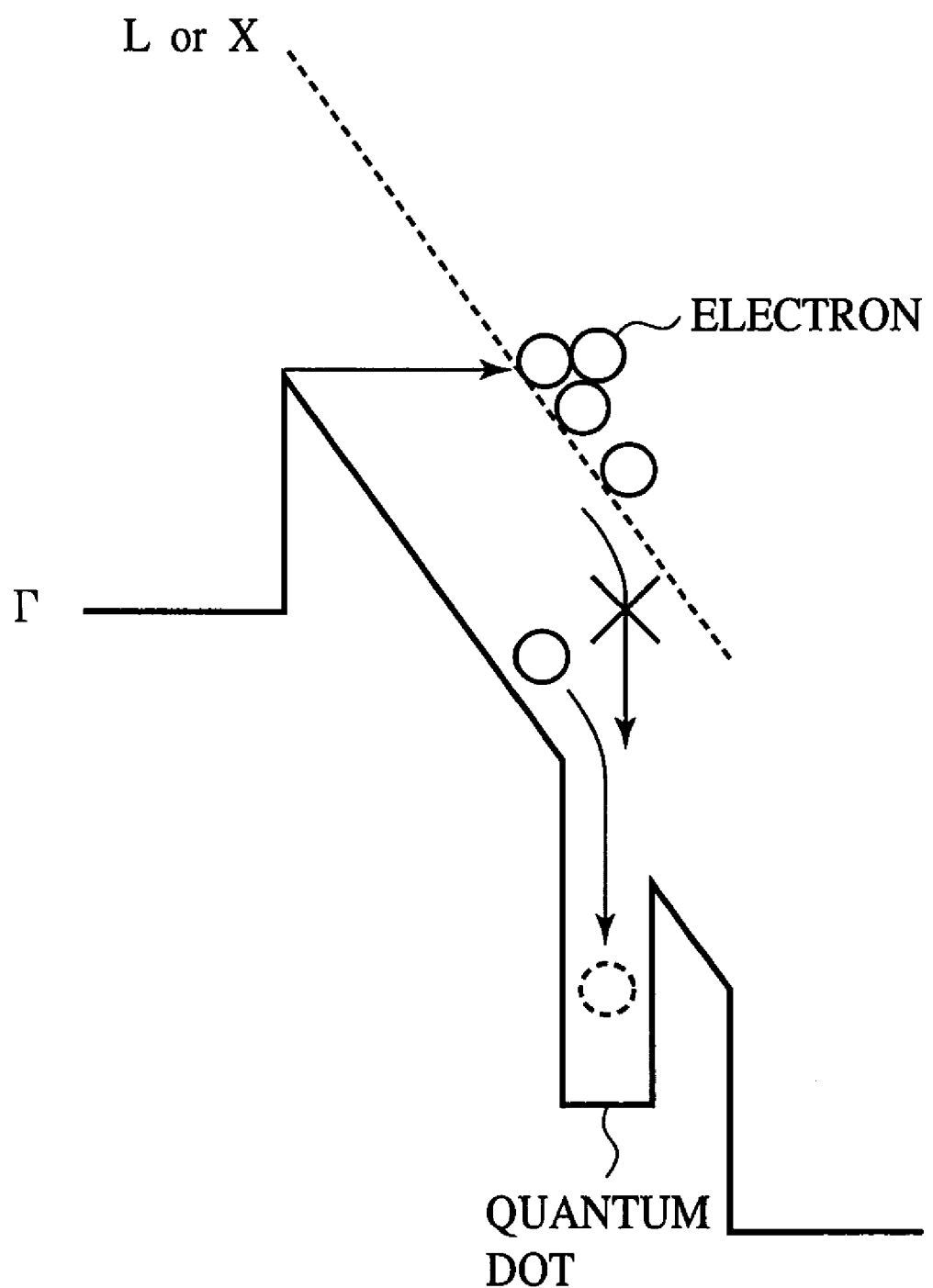
FIG. 4 is an energy band diagram schematically showing the operational state of the infrared photodetector using as the intermediate layer AlGaAs of high Al composition required for the sensitivity improvement.
Figure 5:
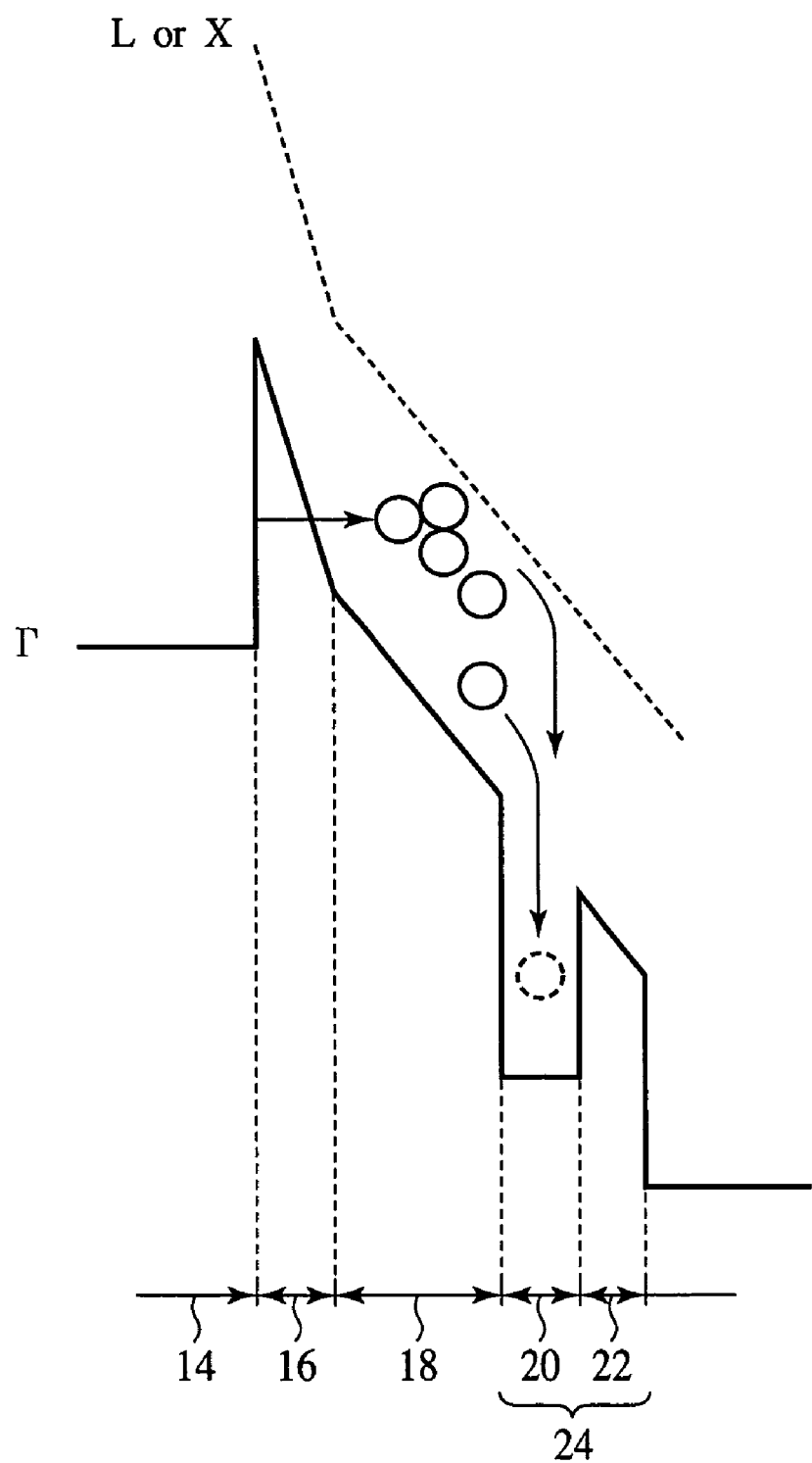
FIG. 5 is an energy band diagram showing the principle of the infrared photodetector according to the embodiment of the present invention.
Figure 6:
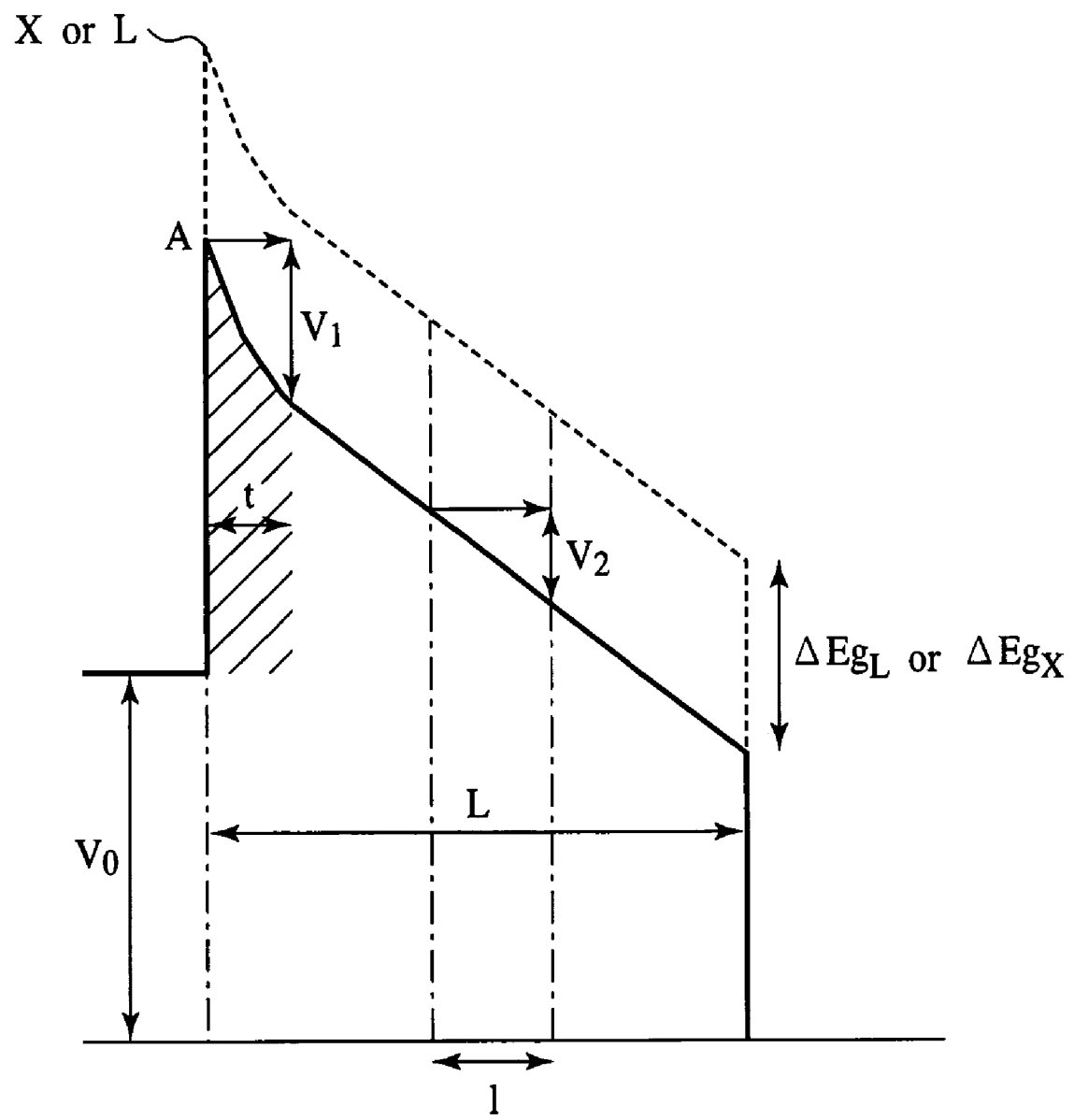
FIG. 6 is a view of a model of the energy band structure used in the research of optimizing the impurity doped layer.
Figure 7:
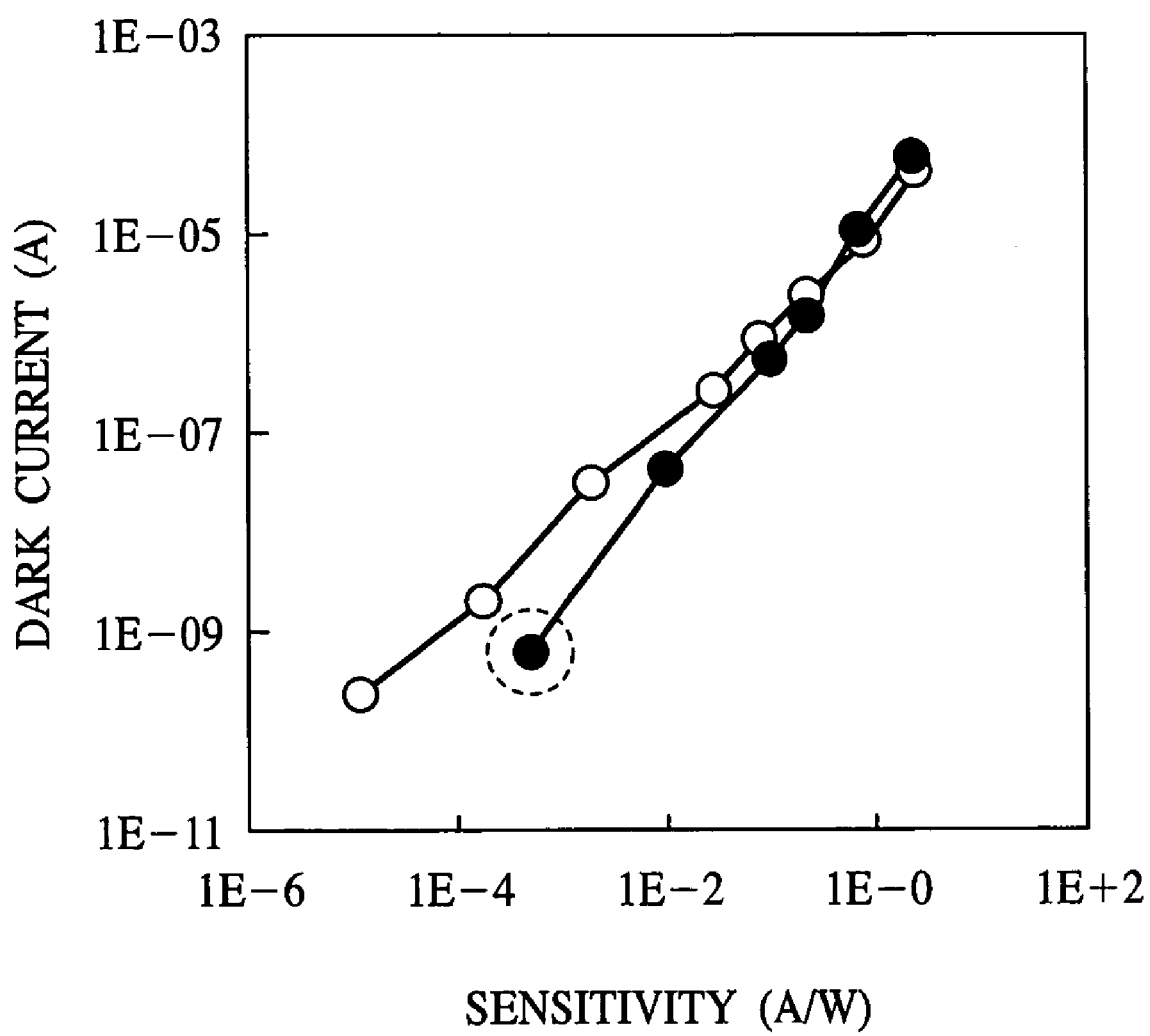
FIG. 7 is a graph showing the result of evaluating the infrared photodetector according to the embodiment of the present invention.

FIG. 1 is a diagrammatic sectional view showing the structure of the infrared photodetector according to the present embodiment. FIG. 2 is a graph showing the dependency of the energy heights of L band and X band from the Γ band of AlGaAs and the potential barrier height for GaAs on the Al composition of AlGaAs. FIG. 3 is an energy band diagram schematically showing the operational state of the infrared photodetector using as the intermediate layer GaAs or AlGaAs of low Al composition. FIG. 4 is an energy band diagram schematically showing the operational state of the infrared photodetector using as the intermediate layer AlGaAs of high Al composition required for the sensitivity improvement. FIG. 5 is an energy band diagram showing the principle of the infrared photodetector according to the present embodiment. FIG. 6 is a view of a model of the energy band structure used in the research of optimizing the impurity doped layer. FIG. 7 is a graph showing the result of evaluating the infrared photodetector according to the present embodiment. FIGS. 8A-8C and 9A-9B are sectional views showing the method of manufacturing the infrared photodetector according to the present embodiment.

First, the structure of the infrared photodetector according to the present embodiment will be explained with reference to FIGS. 1 to 7.

On a semiconductor substrate 10 of GaAs, a buffer layer 12 of, e.g. a 100 nm-thickness GaAs layer is formed. On the buffer layer 12, a lower contact layer 14 (the first contact layer) of, e.g., a 500 nm-thickness GaAs layer is formed.

On the lower contact layer 14, an impurity doped layer 16 (impurity doped region) of, e.g., a 10 nm-thickness AlGaAs layer is formed. In the impurity doped layer 16, an n-type impurity is doped. When silicon, for example, is used as the impurity, the silicon enters in the sites of the group III element, and the impurity doped layer 16 becomes n-type. On the impurity doped layer 16, a base layer 18 of, e.g., a 40 nm-thickness AlGaAs layer is formed. In the present embodiment, for the convenience of the explanation, the impurity doped layer 16 and the base layer 18 are discriminated from each other, but it is possible to consider that the impurity doped layer 16 is a partial region of the base layer 18, which is doped with the impurity.

On the base layer 18, a quantum dot stack 24 is formed. The quantum dot stack 24 is formed of quantum dots 20 of InAs and an intermediate layer 22 of, e.g. a 50 nm-thickness AlGaAs repeatedly stacked (e.g., 10 times). In the present embodiment, for the convenience of the explanation, the base layer 18 and the quantum dot stack 24 are discriminated from each other, but the base layer 18 can also function as a barrier layer which buries the quantum dots 20, as do the intermediate layer 22 and is functionally considered as a part of the intermediate layers, i.e., a part of the quantum dot stack 24. In view of this, in the specification of the present application, the impurity doped layer 16 and the base layer 18 are called in some cases the intermediate layer.

On the quantum dot stack 24, the upper contact layer 26 (the second contact layer) of, e.g., a 150 nm-thickness GaAs layer is formed. In a partial region of the lower contact layer 14, the upper contact layer 26, the quantum dot layer structure 24, the base layer 18 and the impurity doped layer 16 are removed, and a lower electrode layer 28 is formed on the lower contact layer in this region. On the upper contact layer 26, an upper electrode 30 is formed.

As described above, the infrared photodetector according to the present embodiment is an quantum dot infrared photodetector including quantum dots of InAs and intermediate layers of AlGaAs burying the quantum dots, and the impurity doped layer 16 is formed between the lower contact layer 14 and the base layer 18.

The reason for and the effects of forming the impurity doped layer 16 between the lower contact layer 14 and the base layer 18 will be explained below.

As described above, in the infrared photodetector using InAs as the quantum dots, the intermediate layers are changed from GaAs to AlGaAs, the sensitivity of the low current region relatively lowers. The inventor of the present application made earnest studies and has found that a cause for the sensitivity decrease is an intrinsic phenomenon accompanying the change of the material of the intermediate layers.

In the general semiconductor devices, the energy of electrons to be considered is relatively low, and as the conduction band of the semiconductor usually the so-called Γ conduction band (Γ band) alone is considered. Actually, however, the conduction bands called the L band and the X band are present in regions of higher energies.

FIG. 2 is a graph of the dependency of the energy barrier height of the X band and the L band from the Γ band and the potential barrier height for GaAs on the Al composition of AlGaAs. The physical property constants used in the computation were those used in I. Vurgaftman et al. ("Band parameters for III-V compound semiconductors and their alloys", Journal of Applied Physics, Vol. 89, No. 11, 2001, pp. 5815-5875). In the barrier height for GaAs, the contribution of the conduction bands to the band width differences was 60%. The device temperature was assumed to be 77 K.

As evident in FIG. 2, the Al composition of the AlGaAs intermediate layer is increased to thereby increase the potential barrier height formed by the Γ band for the GaAs, but the energy heights of the X band and the L band from the Γ band decrease. Accordingly, in the AlGaAs intermediate layer of high Al composition, the influence of the X band and the L band cannot be ignored.

FIGS. 3 and 4 are energy band diagrams schematically showing the device operation in such case. In FIG. 3, the intermediate layer is GaAs or AlGaAs of low Al composition, and in FIG. 4, the intermediate layer is AlGaAs of the Al composition of a height necessary for the improvement of the sensitivity.

In FIGS. 3 and 4, the energy differences between the X band and the L band of the quantum dot region and the X band and the L band of the intermediate layer region are omitted. This is because the potential distribution of the conduction band as the quantum dot infrared photodetector is designed based on the Γ band and is not intrinsic as long as the electrons do not return to the Γ band whatever manner the electrons are conducted in the X band and the L band.

As shown in FIG. 3, when the intermediate layer is GaAs or AlGaAs of relatively low Al composition, the conduction bands of the X band or the L band position sufficiently high with respect to the Γ band in terms of energy, and the electrons injected from the electrode layer (left in the drawing) mostly remain in the Γ band and conduct in the device. The electrons can be easily captured in the quantum dot layer.

In contrast to this, when the intermediate layer is AlGaAs of the high Al composition necessary for the sensitivity improvement, as shown in FIG. 4, the X band or the L band comes near to the Γ band in terms of energy, a certain part of the electrons injected from the electrode layer (left in the drawing) is scattered into the conduction band of the X band or the L band. Accordingly, the electrons cannot be easily captured by the quantum dots designed mainly in the Γ band, and the sensitivity lowers.

Furthermore, when the intermediate layer is formed of a material of a high barrier height, such as AlGaAs, high energy is required to inject electrons from the electrode layer. Resultantly, with the dark current value set the same, the device including the intermediate layer of a material of a large band width requires the application of higher voltage. This further accelerates the electrons obtaining energy required to be scattered into the X band or the L band, which resultantly accelerates the relative decrease of the sensitivity.

Here, the purpose of incorporating the intermediate layer of a large band width is to increase the sensitivity by emphasizing the quantum confinement effect in the quantum dots. Accordingly, the problem of the sensitivity decrease described above can be solved by maintaining the potential barrier height of the intermediate layer high while enhancing the injection of electrons between the electrode layer and the intermediate layer.

Then, in the infrared photodetector according to the present embodiment, the AlGaAs impurity doped layer 16 is formed between the lower contact layer 14 and the base layer 18. The impurity doped layer 16 of a prescribed concentration is provided in a prescribed region between the GaAs lower contact layer 14 and the base layer 18, whereby the potential distribution in the region where the impurity doped layer 16 is formed can be varied, and the injection of electrons from the side of the lower contact layer 14 can be enhanced.

When the intermediate layer is formed of a material of a large band width in comparison with the electrode layer (contact layer), with an impurity doped in a region near the location where the intermediate layer is in contact with the electrode layer, the potential distribution is curved due to the space charge by the ionized impurity. As shown in, e.g., FIG. 1, the impurity doped layer 16 with an n-type impurity doped is provided between the lower contact layer 14 and the base layer 18, whereby the energy level of the conduction band in the impurity doped layer 16 shifts to the lower energy side by the space charge of the impurity ionized in the impurity doped layer 16 (refer to FIG. 5).

Thus, the potential barrier in the region where the impurity doped layer 16 is formed becomes effectively thin, and the tunnel current easily generates. Resultantly, the device current for a constant applied device voltage increases. The electrons injected from the side of the lower contact layer 14 can tunnel without surmounting the potential barrier of the impurity doped layer 16, and the electrons can be prevented from obtaining the energy required to be scattered into the X band or the L band.

Then, the impurity concentration Nd and the thickness t for the impurity doped layer 16 to suitably produce such effects will be discussed. In this discussion, the model of the energy band structure shown in FIG. 6 is considered. In the drawing, "L" represents the thickness of the active region sandwiched between the electrodes (contact layers), and "l" represents the distance equivalent to one cycle of the quantum dot layer.

The potential distribution V in the region of a space charge of a volume density Nd is expressed by the following Poisson's equation wherein "e" is an elementary electric charge, and "∈" is a dielectric constant in this region.

$$d^2V/dx^2 = eNd/\in$$

When the voltage to be applied to the device is Vo, the potential difference $V_1$ from the end of the impurity doped layer 16 as viewed from the summit of the potential barrier between the lower contact layer 14 and the impurity doped layer 16 is given as follows by solving the Poisson's equation. Here, the approximation of $V_1 \ll Vo$ is used.

$$V_1 = (½)(eNd/\in)t^2 + (t/L)Vo$$

Accordingly, when this potential difference $V_1$ is smaller than the lower one of the energy difference between the Γ band and X band ($\Delta Eg_X$ in the drawing) and the energy difference between the Γ band and L band ($\Delta Eg_L$ in the drawing) (hereinafter called an energy difference Eo), at least the injection of the electrons injected at Point A in FIG. 6 directly into the X band or the L band can be suppressed. Thus, Expression (1) described below gives the impurity concentration Nd to be doped into the impurity doped layer 16 and the upper limit of the region width t.

$$(½)(eNd/\in)t^2 + (t/L)Vo < Eo \quad (1)$$

The first term of the left side of Expression (1) expresses the potential distribution in the homogeneous space charge state, and the potential distribution is given by Poisson's equation under the boundary condition of a potential at x=t and an electric field of 0. This boundary condition corresponds to the above-described approximation of $V_1 \ll Vo$. The second term of the left side of Expression (1) is the correction term for this approximation and takes into account of a potential variation of the bias voltage Vo from x=0 to x=t (linear approximation).

The impurity doped layer 16 which satisfies Expression (1) is provided, whereby the dark current at a low voltage is ensured while the electrons injected from the side of the lower contact layer 14 can be prevented from being scattered into the X band or the L band to resultantly fail to contribute to the sensitivity of the quantum dot infrared photodetector.

Such usual quantum dot infrared photodetector uses, in many cases, the layer structure of a plurality of quantum dot layers stacked with interposing the intermediate layers so as to obtain sufficient quantum efficiency. This is the same with the infrared photodetector according to the present embodiment shown in FIG. 1. In this case, the electrons present in the device are accelerated by internal electric field in the device and, when the electrons obtain sufficient energy, the electrons as well are scattered in the X band or the L band and cannot be easily captured by the downstream quantum dots.

It is difficult to think, considering influences of the so-called wet layers, etc. that the electrons flowing in the active region transfer over the distance equivalent to or more than one cycle of such quantum dot layer structure (the quantum dot stack 24) without any scattering. Accordingly, the intra-device potential distribution is designed so that the maximum value of the energy obtained while the electrons are transferring over one cycle of the quantum dot stack 24 does not exceed either the energy difference Eo, whereby the effect of the present invention can be more sufficiently exerted.

The impurity doped layer 16 produces the potential decrease corresponding to a potential difference $V_1$. Accordingly, the impurity doped layer 16 has the effect of reducing the electric field in the device corresponding to the potential difference $V_1$. At this time, the maximum value $V_2$ of the energy the electrons obtain by being accelerated by the distance equivalent to one cycle of the quantum dot stack 24 is $$V_2 = ((Vo - V_1)/(L-t)) \times l,$$

and it is more preferable to satisfy $$Vo - ((L-t)/l)Eo < (½)(eNd/\in)t^2 + (t/L)Vo \quad (2).$$

Expression (2) gives upper limit values of the impurity concentration to be doped into the AlGaAs impurity doped layer 16 and the region width t.

The term: $(Vo-V_1)/(L-t)$ is an electric field due to a voltage Vo in the region except the impurity doped region (approximate to a uniform electric field), and expresses that a potential difference between two points separated by a distance l in the electric field ($V_2$) is (electric field)×(distance)=(Vo−$V_1$)/(L−t)×l.

Based on the above-described results, it is preferable that the impurity concentration Nd and the thickness t of the impurity doped layer 16 are suitably set to satisfy at least one of the relationships expressed by the following two expressions when a voltage to be applied to the device is "Vo", a thickness of the active region sandwiched by the electrodes is "L", the minimum value of the thickness of the intermediate layer is "l", the minimum value of energy differences between the Γ band and the conduction band thereof except the Γ band of the intermediate layer is "Eo", an elementary electric charge is "e", and the dielectric constant of the intermediate layer is "∈".

$$(½)(eNd/∈)t^2+(t/L)Vo<Eo$$

$$Vo-((L-t)/l)Eo<(½)(eNd/∈)t^2+(t/L)Vo$$

In, the infrared photodetector according to the present embodiment, when the device length L is 500 nm, the distance equivalent to one cycle of the quantum dots (thickness of the intermediate layer 22) is 50 nm, the thickness t of the impurity doped layer 16 is 10 nm, the impurity concentration Nd of the impurity doped layer 16 is 8.5×10$^{17}$ cm$^{-3}$, and the Al composition of the AlGaAs layer is 15%, the dielectric constant of the intermediate layer 22 is 12.7, and the energy difference Eo between the Γ conduction band and the X conduction band or the L conduction band is 163 mV. When the voltage Vo to be applied to the device is 1 V, $$V_1=(½)(eNd/∈)t^2+(t/L)Vo=78.8\ mV$$

and satisfies the relationship expressed by Expression (1) described above.

$$V_2=Vo-((L-t)/l)×Eo=-628\ mV$$

and satisfies the relationship expressed by Expression (2) described above.

FIG. 7 shows the result of evaluation the actually manufactured infrared photodetector according to the present embodiment. In the graph, the plain circles indicate the sample of the conventional structure, which does not include the impurity doped layer 16. The black circles indicate the sample of the present invention, which includes the impurity doped layer 16. The device size of the infrared photodetector was 500 μm-square, and the measurement temperature was 80 K.

The operation point indicated by the dotted line circle in FIG. 7 is Vo=2.2 V. In this case, the potential differences $V_1$, $V_2$ are respectively $$V_1=(½)(eNd/∈)t^2+(t/L)Vo=105\ mV$$

$$V_2=Vo-((L-t)/l)×Eo=572\ mV$$

and which satisfy the relationship expressed by Expression (1) but do not satisfy the relationship expressed by Expression (2). However, as evident in FIG. 7, it is found that the sample of the present invention including the impurity doped layer 16 can suppress the relative reduction of the sensitivity in the low current region in comparison with the sample of the conventional structure without the impurity doped layer 16.

It is not necessary to satisfy both relationships of Expression (1) and Expression (2), and the impurity doped layer 16 is designed so that at least one of both relationships can be satisfied, whereby the effect of the present invention can be produced.

Next, the method of manufacturing the infrared photodetector according to the present embodiment will be explained with reference to FIGS. 8A to 9C.

First, on the substrate 10, such as GaAs, the buffer layer 12, such as GaAs, is grown by a known crystal growth technique, e.g., molecular beam epitaxy. The film thickness of the GaAs buffer layer 12 varies depending on the device structure design but may be, e.g., 100 nm.

Figure 8A:
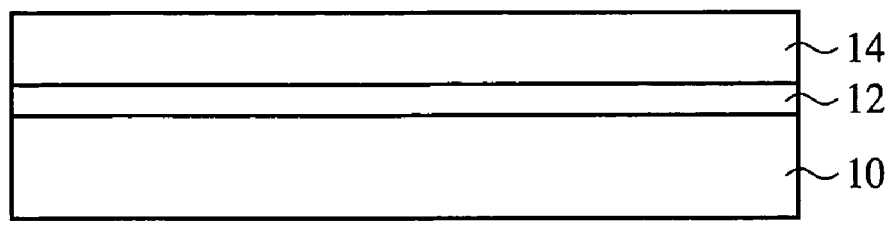
FIGS. 8A-8C and 9A-9B are sectional views showing the method of manufacturing the infrared photodetector according to the embodiment of the present invention.

Then, on the buffer layer 12, the lower contact layer 14, e.g. GaAs, is grown by a known crystal growth technique, e.g., molecular beam epitaxy (FIG. 8A). The film thickness of the lower contact layer 14 varies depending on the device structure design but may be, e.g., 500 nm. For doping the lower contact layer 14, Si, for example, is used as an impurity, and the concentration is, e.g., 1×10$^{18}$ cm$^{-3}$.

Figure 8B:
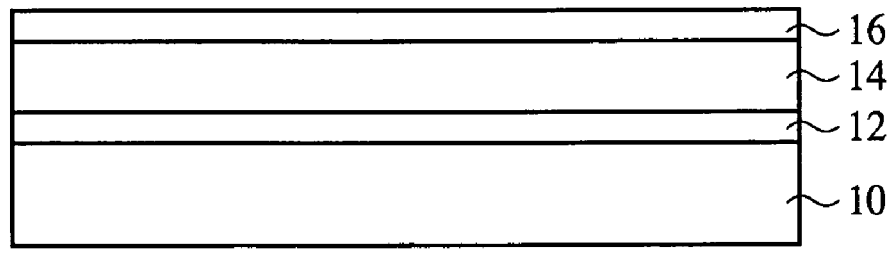

Next, on the lower contact layer 14, the AlGaAs impurity doped layer 16 is grown at a substrate temperature of, e.g., 580° C. by a known crystal growth technique, e.g., molecular beam epitaxy (FIG. 8B). The film thickness of the AlGaAs impurity doped layer 16 varies depending on intended characteristics of the quantum dot infrared photodetector but may be, e.g., 10 nm. For doping the AlGaAs impurity layer 16, although varied depending on the intended characteristics of the quantum dot infrared photodetector, the impurity is, e.g., Si, the concentration is, e.g., 8.5×10$^{17}$ cm$^{-3}$. The composition of the AlGaAs impurity doped layer 16 is, e.g., 15% Al composition although varied depending on intended characteristics of the quantum dot infrared photodetector.

Then, on the AlGaAs impurity doped layer 16, the AlGaAs base layer 18 is grown at, e.g., 580° C. substrate temperature by a known crystal growth technique, e.g., molecular beam epitaxy. The film thickness of the AlGaAs base layer 18 is, e.g., 40 nm although varied depending on the intended characteristics of the quantum dot infrared photodetector. The AlGaAs base layer 18 has, e.g., 15% Al composition although varied depending on intended characteristics of the quantum dot infrared photodetector.

Next, on the AlGaAs base layer 18, the InAs quantum dots 20 are grown by self-organization growth using a known crystal growth technique, e.g., molecular beam epitaxy. The InAs quantum dots 20 are grown by feeding a raw material of a total supply amount equivalent to, e.g., 2.3 molecular layers at, e.g., a 0.2 molecular layer/second rate at, e.g., 470° C. substrate temperature. The configuration of the InAs quantum dots 20 grown under these conditions was 1.4 nm height and 16 nm horizontal width, based on the evaluation of the sample grown under the same growth conditions.

Figure 8C:
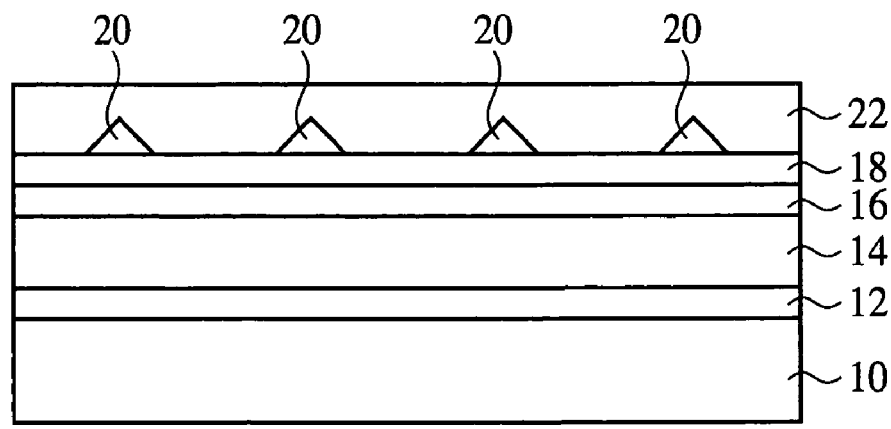

Then, on the AlGaAs base layer 18 with the InAs quantum dots 20 formed on, the AlGaAs intermediate layer is grown by a known crystal growth technique, e.g., molecular beam epitaxy at, e.g., 580° C. substrate temperature (FIG. 8C). The film thickness of the AlGaAs intermediate layer 22 is, e.g., 50 nm although varied depending on intended characteristics of the quantum dot infrared photodetector. The composition of the AlGaAs intermediate layer 22 is, e.g., 15% Al composition although varied depending on the intended characteristics of the quantum dot infrared photodetector.

Then, on the AlGaAs intermediate layer 22, in the same procedures as described above, the InAs quantum dots and the AlGaAs intermediate layers 22 are grown repeatedly prescribed times, e.g., ten times to form the quantum dot stack 24 of the InAs quantum dots 20 and the AlGaAs intermediate layers 22 repeatedly stacked.

Figure 9A:
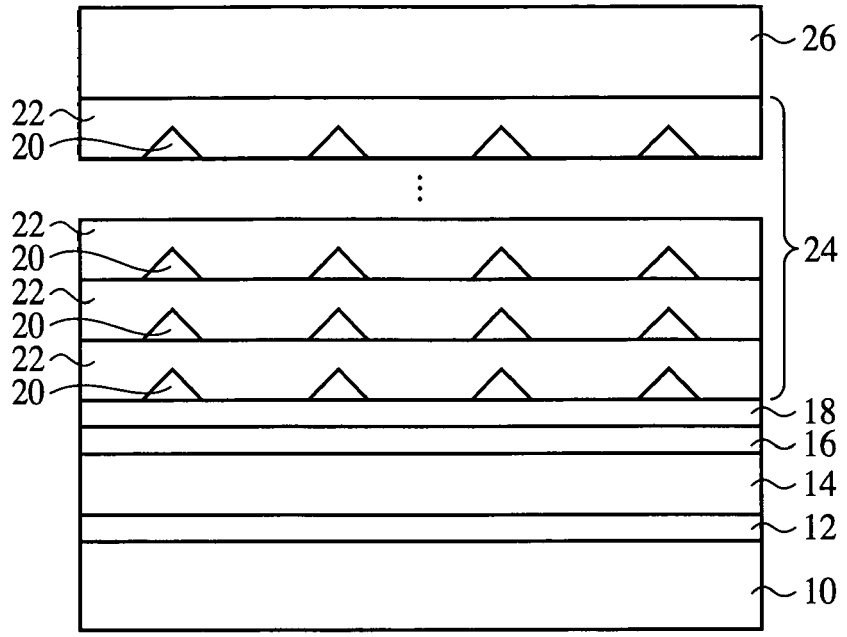

Next, on the quantum dot stack 24, the GaAs upper contact layer 26 is grown by a known crystal growth technique, e.g., molecular mean epitaxy (FIG. 9A). The film thickness of the GaAs upper contact layer 26 is, e.g., 150 nm although varied depending on the device structure design. For doping the GaAs upper contact layer 26, the impurity is, e.g., Si, the concentration is, e.g., $1\times10^{18}$ cm$^{-3}$.

Next, by photolithography and etching, the GaAs upper contact layer 26, the quantum dot stack 24, the AlGaAs base layer 18 and the AlGaAs impurity doped layer 16 in the lower electrode forming region are removed to expose the surface of the GaAs lower contact layer 14.

Figure 9B:
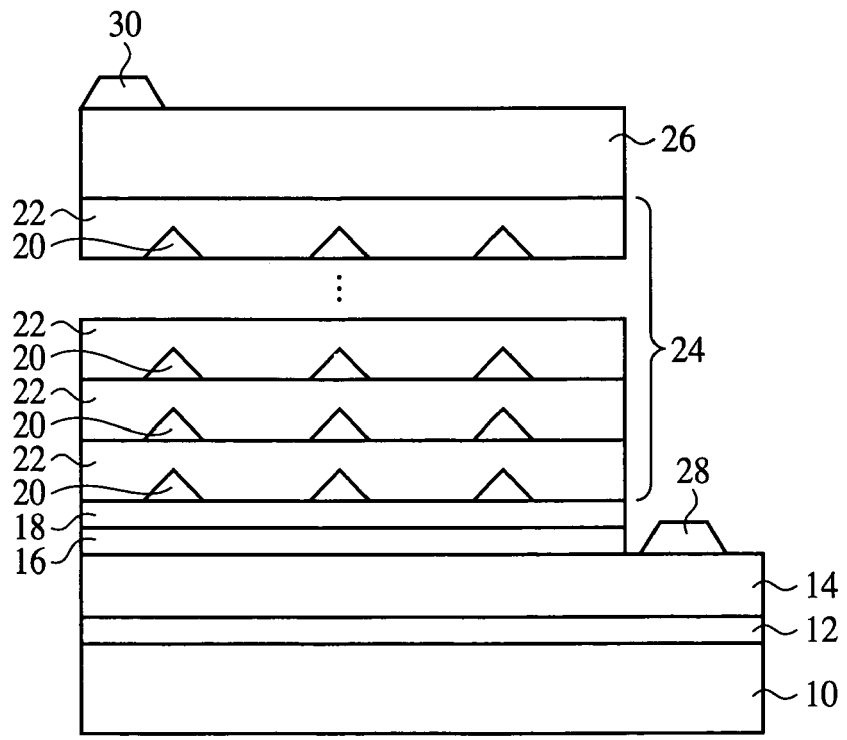
Figure 10:
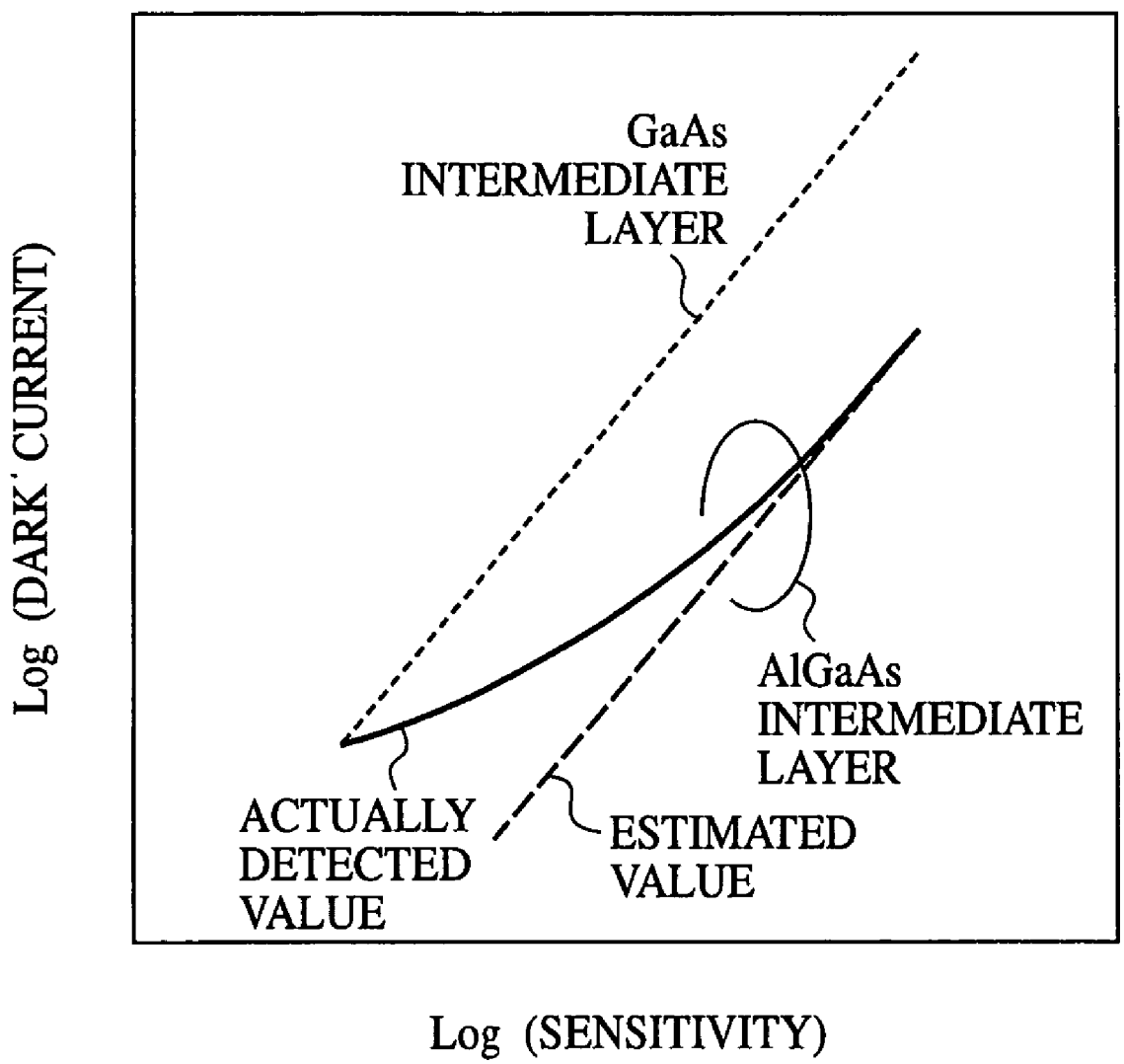
FIG. 10 is a graph schematically showing the relationships between the sensitivity and the dark current of the quantum dot infrared photodetector with the operational voltage varied.

Next, by, e.g., evaporation, sputtering or other methods, on the exposed GaAs lower contact layer 14 and the GaAs upper contact layer 26, the lower electrode layer 28 and the upper electrode layer 30 are respectively formed, and the infrared photodetector according to the present embodiment is completed (FIG. 9B).

As described above, according to the present embodiment, the injection of electrons between the lower contact layer 14 and the base layer (intermediate layer) from the side of the lower contact layer 14 is accelerated to form the impurity doped layer 16 for suppressing the scattering of the electrons into the conduction bands other than the Γ conduction band, whereby even when the quantum confinement effect is improved by using a material, such as AlGaAs, of a wide band width as the intermediate layer, the relative decrease of the sensitivity in the low current region can be suppressed. Thus, the sensitivity characteristics of the infrared photodetector can be improved.

Modified Embodiments

The present invention is not limited to the above-described embodiment and can cover other various modifications.

For example, in the above-described embodiment, molecular beam epitaxy is used in manufacturing the infrared photodetector. In manufacturing the infrared photodetector, other crystal growth techniques which can form quantum dots can be used. Such crystal growth method is, e.g., metal organic chemical vapor deposition method.

In the above-described embodiment, the quantum dot infrared photodetector includes the combination of quantum dots of InAs and the quantum dot buried layer (intermediate layer) of AlGaAs. The combination of the material of the quantum dots and the material of the quantum dot buried layer is not limited to that of the above-described embodiment. For example, the quantum dots can be formed of InAs, InGaAs, GaN, InN, GaAs, or others, and the quantum dot buried layer can be formed of AlGaAs, InGaP, InP, InAlAs or others.

Specific combinations of the quantum dots/the quantum dot buried layer are InAs/GaAs, InGaAs/GaAs, InAs/AlGaAs, InAs/InGaP, InGaAs/InGaP, InAs/InP, InGaAs/InP, InAs/InAlAs, InGaAs/InAlAs, InAs/AlGaN, GaAs/AlGaN, InN/AlGaN, GaN/AlGaN, etc.

In the above-described embodiment, in the active region, electrons are scattered into the X conduction band or the L conduction band. The present invention is applicable to cases that electrons are scattered into other conduction bands near the Γ conduction band.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An infrared photodetector comprising:
a first contact layer formed over a semiconductor substrate;
a quantum dot stack formed above the first contact layer, the quantum dot stack including a plurality of intermediate layers of a first semiconductor material and a plurality of quantum dot layers, each quantum dot layer including a plurality of quantum dots of a second semiconductor material whose band width is narrower than the band width of the first semiconductor material, said plural intermediate layers and said plural quantum dot layers being stacked alternately;
a second contact layer formed on top of the quantum dot stack, and
an n-type impurity doped layer formed between the first contact layer and a lowermost intermediate layer of the plural intermediate layers, the lowest intermediate layer of the plural intermediate layers being nearest to the first contact layer.

2. The infrared photodetector according to claim 1, wherein
the n-type impurity doped layer has a thickness and an impurity concentration set to satisfy, with a drive voltage applied between the first contact layer and the second contact layer, $$V_1 < Eo$$

when a potential fall due to the n-type impurity doped layer on is $V_1$, and an energy difference between a Γ conduction band and another conduction band nearest to the Γ conduction band in each of the intermediate layers is Eo.

3. The infrared photodetector according to claim 1, wherein
the n-type impurity doped layer has a thickness t and an impurity concentration Nd set to satisfy, with a drive voltage applied between the first contact layer and the second contact layer, $$(½)(eNd/\in)t^2 + (t/L)Vo < Eo$$

when an elementary electric charge is e, an impurity concentration of the n-type impurity doped layer is Nd, a dielectric constant of each of the intermediate layers is $\in$, a thickness of the n-type impurity doped layer is t, a thickness of the quantum dot stack between the first contact layer and the second contact layer is L, the drive voltage is Vo, and an energy difference between a Γ conduction band and another conduction band nearest to the Γ conduction band in each of the intermediate layers is Eo.

4. The infrared photodetector according to claim 2, wherein
the conduction band nearest the Γ conduction band is X conduction band or the L conduction band.

5. The infrared photodetector according to claim 1,
wherein the n-type impurity doped layer has a thickness and an impurity concentration set to satisfy, with a drive voltage applied between the first contact layer the second contact layer, $$(Vo - V_1)l/(L-t) < Eo$$

when the drive voltage is Vo, a potential fall due to the n-type impurity doped layer is $V_1$, a thickness of each of the intermediate layers is l, a thickness of the quantum dot stack between the first contact layer and the second contact layer is L, a thickness of the n-type impurity doped layer is t, and an energy difference between a Γ conduction band and another conduction band nearest to the Γ conduction band in each of the intermediate layers is Eo.

6. The infrared photodetector according to claim 5, wherein
the conduction band nearest the Γ conduction band is the X conduction band or the L conduction band.

7. The infrared photodetector according to claim 2, wherein
the n-type impurity doped layer has a thickness and an impurity concentration set to satisfy, with a drive voltage applied between the first contact layer and the second contact layer, $$((Vo-V_1)l)/(L-t) < Eo$$

when the drive voltage is Vo, a potential fall due to the n-type impurity doped layer is $V_1$, a thickness of each of the intermediate layers is l, a thickness of the quantum dot stack between the first contact layer and the second contact layer is L, a thickness of the n-type impurity doped layer is t, and an energy difference between a Γ conduction band and another conduction band nearest to the Γ conduction band in each of the intermediate layers is Eo.

8. The infrared photodetector according to claim 7, wherein
the conduction band nearest the Γ conduction band is the X conduction band or the L conduction band.

9. The infrared photodetector according to claim 3, wherein
the n-type impurity doped layer has a thickness and an impurity concentration set to satisfy, with a drive voltage applied between the first contact layer and the second contact layer, $$((Vo-V_1)l)/(L-t) < Eo$$

when the drive voltage is Vo, a potential fall due to the n-type impurity doped layer is $V_1$, a thickness of each of the intermediate layers is l, a thickness of the quantum dot stack between the first contact layer and the second contact layer is L, a thickness of the n-type impurity doped layer is t, and an energy difference between a Γ conduction band and another conduction band nearest to the Γ conduction band in each of the intermediate layers is Eo.

10. The infrared photodetector according to claim 9, wherein
the conduction band nearest the Γ conduction band is the X conduction band or the L conduction band.

11. The infrared photodetector according to claim 1, wherein
the n-type impurity doped layer has a thickness and an impurity concentration set to satisfy, with a drive voltage applied between the first contact layer and the second contact layer, $$Vo-((L-t)/l)Eo < (½)(eNd/\in)t^2+(t/L)Vo$$

when the drive voltage is Vo, a thickness of the quantum dot stack between the first contact layer and the second contact layer is L, a thickness of the n-type impurity doped layer is t, an energy difference between a Γ conduction band and another conduction band nearest to the Γ conduction band in each of the intermediate layers is Eo, an elementary electric charge is e, an impurity concentration of the n-type impurity doped layer is Nd, and a dielectric constant of each of the intermediate layers is $\in$.

12. The infrared photodetector according to claim 11, wherein
the conduction band nearest the Γ conduction band is the X conduction band or the L conduction band.

13. The infrared photodetector according to claim 2, wherein
the n-type impurity doped layer has a thickness and an impurity concentration set to satisfy, with a drive voltage applied between the first contact layer and the second contact layer, $$Vo-((L-t)/l)Eo < (½)(eNd/\in)t^2+(t/L)Vo$$

when the drive voltage is Vo, a thickness of the quantum dot stack between the first contact layer and the second contact layer is L, a thickness of the impurity doped region is t, an energy difference between a Γ conduction band and another conduction band nearest to the Γ conduction band in each of the intermediate layers is Eo, an elementary electric charge is e, an impurity concentration of the n-type impurity doped layer is Nd, and a dielectric constant of each of the intermediate layers is $\in$.

14. The infrared photodetector according to claim 13, wherein
the conduction band nearest the Γ conduction band is the X conduction band or the L conduction band.

15. The infrared photodetector according to claim 3, wherein
the n-type impurity doped layer has a thickness and an impurity concentration set to satisfy, with a drive voltage applied between the first contact layer and the second contact layer, $$Vo-((L-t)/l)Eo < (½)(eNd/\in)t^2+(t/L)Vo$$

when the drive voltage is Vo, a thickness of the quantum dot stack between the first contact layer and the second contact layer is L, a thickness of the n-type impurity doped layer is t, an energy difference between a Γ conduction band and another conduction band nearest to the Γ conduction band in each of the intermediate layers is Eo, an elementary electric charge is e, an impurity concentration of the n-type impurity doped layer is Nd, and a dielectric constant of each of the intermediate layers is $\in$.

16. The infrared photodetector according to claim 15, wherein
the n-type conduction band near the Γ conduction band is the X conduction band or the L conduction band.

17. The infrared photodetector according to claim 1, wherein the first semiconductor material is GaAs or AlGaAs.

18. The infrared photodetector according to claim 1, wherein the second semiconductor material is InAs or InGaAs.

* * * * *